United States Patent [19]

Russer et al.

[11] 4,060,739
[45] Nov. 29, 1977

[54] CIRCUIT ARRANGEMENT FOR AMPLIFYING PULSED SIGNALS

[75] Inventors: Peter Russer; Johann Gruber, both of Ulm (Danube), Germany

[73] Assignee: Licentia Patent-Verwaltungs-G.m.b.H., Frankfurt am Main, Germany

[21] Appl. No.: 640,152

[22] Filed: Dec. 12, 1975

[30] Foreign Application Priority Data

Dec. 17, 1974 Germany .............................. 2459496

[51] Int. Cl.$^2$ .............................................. H03K 3/33
[52] U.S. Cl. .................................... 307/319; 307/243; 307/268; 307/311; 307/230
[58] Field of Search ............... 307/319, 230, 281, 240, 307/241–243, 268, 256, 311

[56] References Cited

U.S. PATENT DOCUMENTS

| 3,205,376 | 9/1965 | Berry et al. | 307/319 |
| 3,325,655 | 6/1967 | Casale | 307/319 |
| 3,462,699 | 8/1969 | Sear | 307/319 |

FOREIGN PATENT DOCUMENTS

| 596,131 | 4/1960 | Canada | 307/319 |
| 1,173,955 | 3/1959 | France | 307/319 |

Primary Examiner—Stanley D. Miller, Jr.
Assistant Examiner—B. P. Davies
Attorney, Agent, or Firm—Spencer & Kaye

[57] ABSTRACT

A circuit arrangement for amplifying pulsed signals comprises a step recovery diode charged by signals from a signal source through a diode biased in forward direction, the step recovery diode being discharged by a current flowing in the reverse direction through a diode path opened by pulses from a pump source, the reverse current flowing through a load resistor.

4 Claims, 24 Drawing Figures

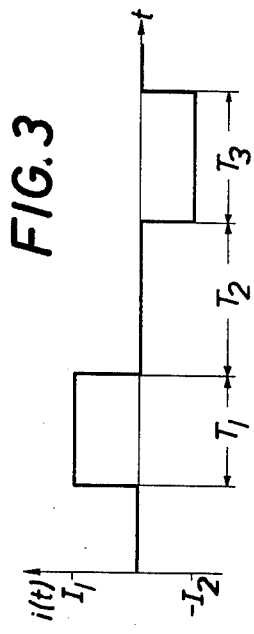
FIG.1
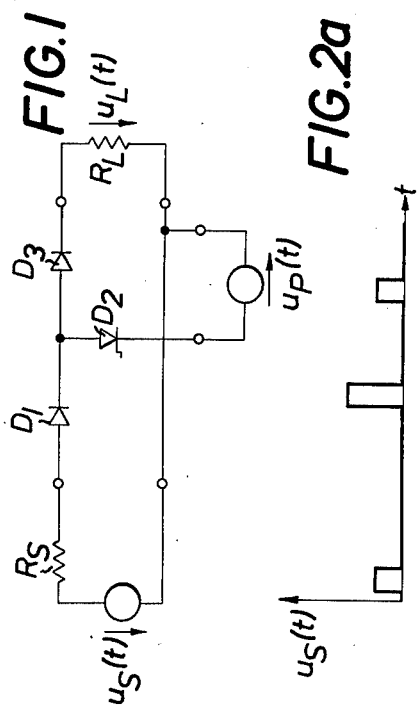
FIG.2a
FIG.2b
FIG.2c
FIG.2d
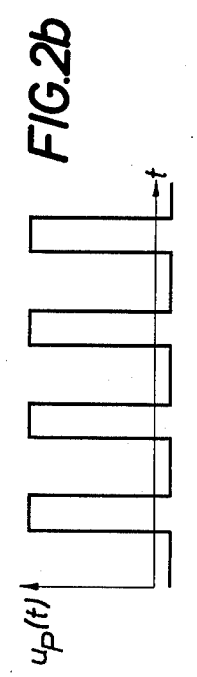
FIG.3
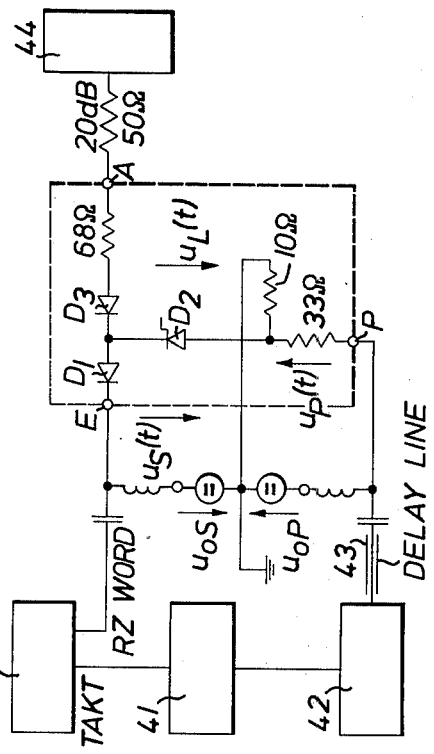
FIG.4

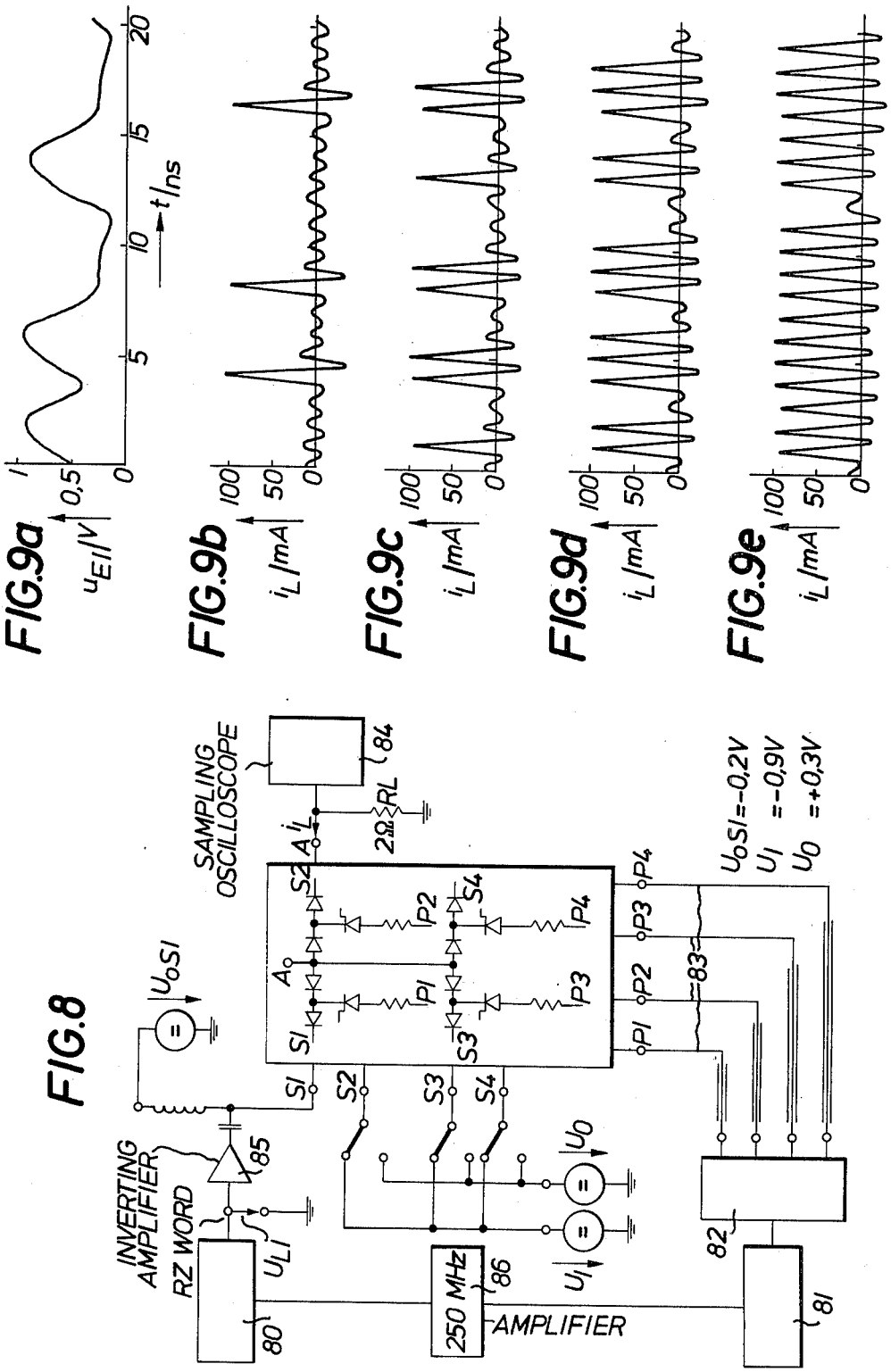

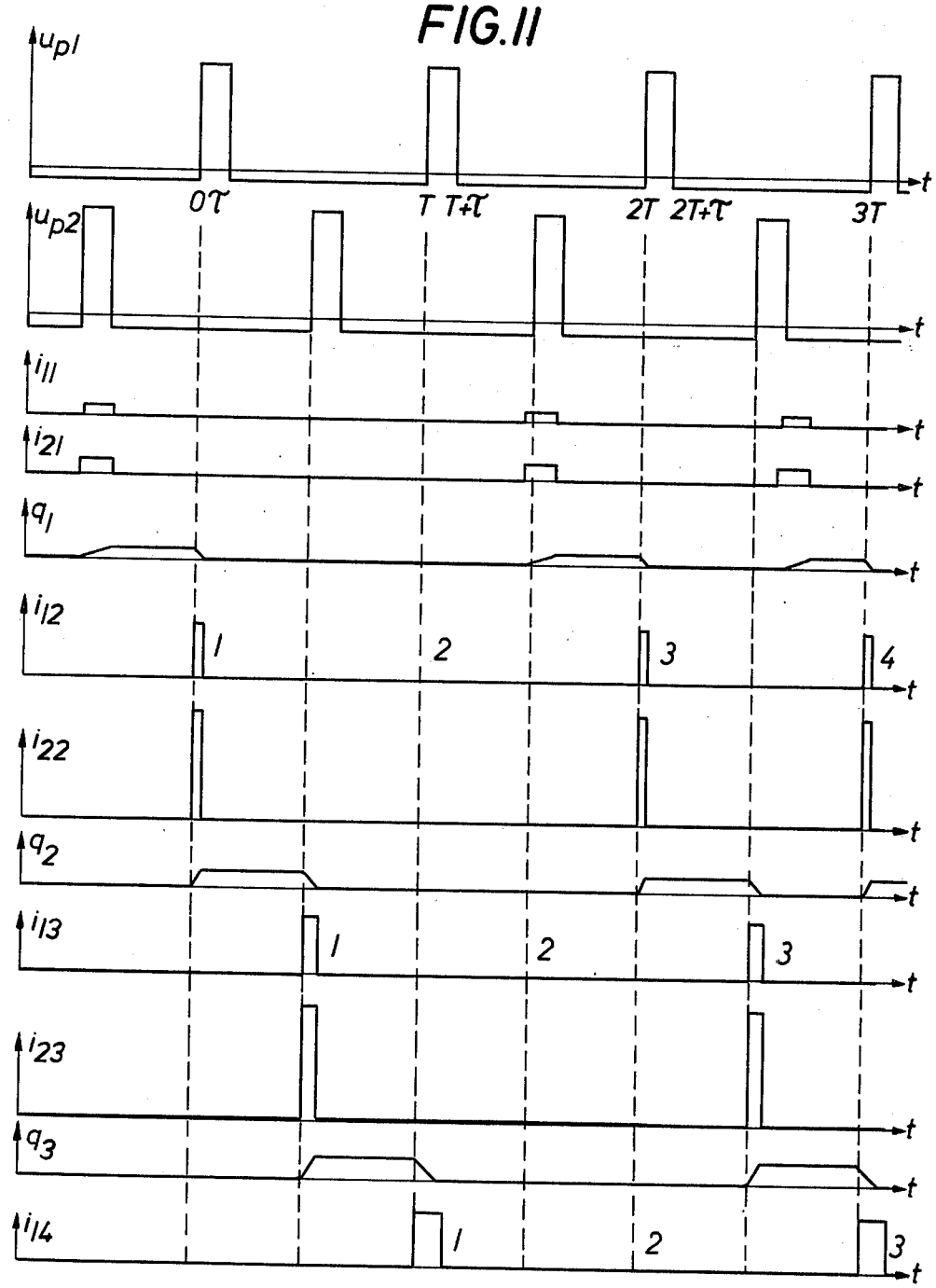

CIRCUIT ARRANGEMENT FOR AMPLIFYING PULSED SIGNALS

BACKGROUND OF THE INVENTION

The invention relates to a circuit arrangement for amplifying pulsed signals.

In particular, wide band optical systems for transmitting information are suitable for transmitting constantly increasing quantities of information, in which systems the information is passed in the form of light pulses by means of optical waveguides. Directly modulated semiconductor lasers are to be used as light emitters and avalanche photo diodes as light receivers. So-called repeater stations are arranged at certain intervals in the transmission path for amplifying and regenerating transmitted pulse sequences. In such a repeater station incoming pulses of light are transformed first into electrical signals by means of a light receiver; these are then regenerated and amplified. A light emitter is again controlled with the processed electrical pulses so that at the output of the repeater station light signals are again ready for further conduction in an optical waveguide. Optical waveguides have a very high bandwidth; it may be envisaged that data flows of several gigabits per second may be transmitted on a single optical waveguide in the form of a glass fibre with the fineness of a hair. Thus, however, problems occur in signal processing in the repeater stations because the speed of conventional electronic circuits is insufficient for processing these data flows.

Amplifier circuits with semiconductor diodes are already known from IRE TRANSACTIONS ON ELECTRON DEVICES, 6 (1959), 341-347; these have, however, a relatively low high-end cutoff frequency.

SUMMARY OF THE INVENTION

It is an object of the invention to provide a circuit arrangement for amplifying and regenerating signals occurring in pulse form in repeater stations in wide band optical information systems, which is suitable for processing data flows of the order of magnitude of some gigabits per second.

According to a first aspect of the invention, there is provided a circuit arrangement for amplifying pulsed signals comprising a step recovery diode, a diode biased in the forward direction through which said step recovery diode is charged by signals from a signal source a diode path opened by pulses from a pump source and through which the charge on said step recovery diode is removed by a current flowing in the reverse direction and a load resistor through which said current flowing in the reverse direction flows.

According to a second aspect of the invention, there is provided a circuit arrangement for amplifying electrical pulsed signals, comprising a step recovery diode which is charged with pulsed signals applied by a signal source by means of a diode biased in forward direction, the step recovery diode being controlled by clock pulses from a pump source such that, by means of a diode path opened by the clock pulses of said pump source, the electrical charge, which is accumulated there by a signal pulse preceding the clock pulse and coming from said signal source, is removed by a current flowing in the reverse direction of said step recovery diode, wherein a load resistor is acted upon by this current flowing in the reverse direction.

BRIEF DESCRIPTION OF THE DRAWINGS

The invention will now be described, in greater detail, by way of example, with reference to the drawings, in which:

FIG. 1 shows a circuit arrangement according to the invention for amplifying and regenerating signals in pulse form;

FIGS. 2a-2d show signal diagrams for the circuit according to FIG. 1;

FIG. 3 shows a process for charging or discharging with a step recovery diode;

FIG. 4 shows a measuring circuit with the amplifier stage according to FIG. 1;

FIG. 8 shows a measuring circuit with the circuit arrangement according to FIG. 6;

FIGS. 9a-9e show a signal plan of the signal path measured in the circuit according to FIG. 8;

FIG. 11 shows the signal path in the circuit arrangement according to FIG. 10;

DESCRIPTION OF THE PREFERRED EMBODIMENTS

Figure 5A:
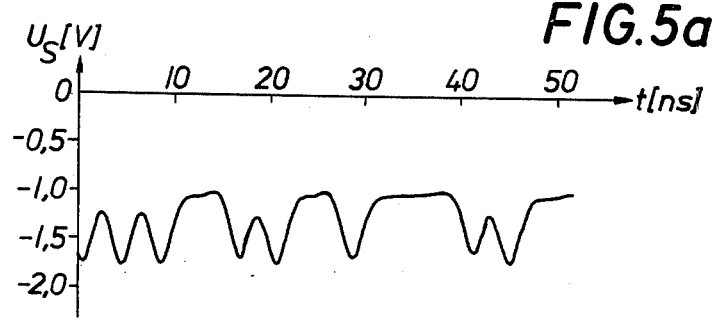
FIGS. 5a-5c show, in the circuit arrangement according to FIG. 4, the signal forms arising.

In a preferred embodiment of the invention, a circuit arrangement for amplifying pulsed signals is characterized by a step recovery diode, which is charged when there are pulsed signals from a signal source by means of a diode biased in forward direction, the step recovery diode being controlled by clock pulses from a pump source; that the accumulated electrical charge is removed there by a clock pulse from the pump source, by means of a diode path opened by the clock pulse from the pump source by a current flowing in the reverse direction of the step recovery diode, wherein a load resistor is acted upon by this current flowing in the reverse direction.

A particularly advantageous refinement of the invention with which an optimum load on the transmitting capacity of an optical waveguide may be achieved, consists of several step recovery diodes, which may be charged by pulsed signals from their signal sources by means of diodes biased in the forward direction, said diodes being controllable by clock pulse sources, so that the discharge currents of the switching storage diodes, released by clock pulses, flow through a common load resistor.

Referring to the drawings, FIG. 1 shows a circuit arrangement according to the invention for amplifying and regenerating pulsed signals in pulse form, which, for example, occur in repeater stations for wide band optical information transmission systems. The mode of operation of this circuit is described using the signal diagram of FIG. 2. At the input of the circuit there is a signal source with a no-load voltage $u_s(t)$ and an internal resistance $R_s$. $D_2$ is a step recovery diode. $D_1$ and $D_3$ are fast switching diodes, for example Schottky diodes with switching times below 100 picoseconds (ps). The switching storage diode $D_2$ is charged during the positive pulses of the source $u_s$ (FIG. 2a) through $D_1$. During this time $u_p$ (FIG. 2b) is slightly negative so that the charging current flows across $D_2$ and not across $D_3$. With the negative bias voltage $u_p$ it is furthermore achieved that $D_1$ and $D_2$ are biased in the forward direction. The charge $Q(t)$ (FIG. 2c) decreases slightly after the end of the charging pulse. One reason for this is the recombination taking place in $D_2$ and a further reason is a short reverse current through $D_1$ until $D_1$ is cut-off. If $u_p$ is positive, then $D_3$ conducts and a current in the reverse direction flows through $D_2$ until the charge $q(t)$ is again lowered to zero. Since the voltages, which decrease at the diodes $D_2$ and $D_3$, are directed in opposite directions, then the voltage $u_L$ at the load resistor $R_L$ (FIG. 2d) is about equal to $u_p(t)$ during the time of discharge. The voltage $u_p$ is designated as a pump voltage, since it pumps the charge from $D_2$ up to a higher potential. The voltage amplification which may be achieved is, in the first instance, given by the level of $u_p$. $R_L$ determines the magnitude of the discharge current and with it, since the charge is preset, the width of the output pulse. The area of the output pulses is proportional to the area of the input pulses, wherein with the output pulses, in the first instance, the width varies. For the change in the output pulse, it is of no importance, whether the width or the height of the input pulse is increased. Only if the input signal is so small that the width of the output signal reaches the sum of the rise and fall time, does the height of the output signal decrease with further reduction in size of the input signal.

$R_L$ is limited upwards in that the maximum width of the output pulse must be smaller than the width of the positive pump pulse and, furthermore, in that, with wide output pulses, the losses through recombination of the charge carriers increase. If $R_L$ is made too small, then the voltage drop at $D_2$ and $D_3$ and at the internal resistance of the pump source, not taken into consideration in FIG. 1, become larger and the voltage amplification drops.

As can be seen from FIG. 2, the position of the input signal has no influence on the position of the front edge of the output pulse, as long as the input signal lies between the pump pulse belonging to the output signal and the previous pump pulse.

In contrast to the voltage amplification the charge amplification is always smaller than 1. For the simplified case shown in FIG. 3 the charge amplification is calculated. The step recovery diode is charged during interval $T_1$ with a constant current $I_1$. During the subsequent interval $T_2$ no current flows. Subsequently, a constant discharge current - $I_2$ is impressed, said current flowing until the diode is completely discharged.

The charge $q$ of the step recovery diode obeys the differential equation $$\frac{dq}{dt} + \frac{q}{\tau_s} = i(t) \tag{1}$$

wherein the storage time of the diode is $\tau_s$. If the diode is completely discharged at the beginning of the time interval $T_1$, then the charge at the end of this time interval is $$q_1 = \tau_s I_1 (1 - e^{-\frac{T_1}{\tau_s}}). \tag{2}$$

At the end of the time interval $T_2$ the charge is $$q_2 = q_1 e^{-\frac{T_2}{\tau_s}}. \tag{3}$$

From the requirement that at the end of $T_3$ the charge has decreased to zero there follows:

$$T_3 = \tau_s \ln(1 + \frac{q_2}{I_2 \tau_s}). \tag{4}$$

The charging amplification $\alpha$ is defined by $$\alpha = \frac{I_2 T_3}{I_1 T_1} \tag{5}$$

and from equations (2) – (5) is obtained $$\alpha = \frac{I_2}{I_1} \frac{\tau_s}{T_1} \ln\left[1 + \frac{I_1}{I_2}(1 - e^{-\frac{T_1}{\tau_s}})e^{-\frac{T_2}{\tau_s}}\right]. \tag{6}$$

The approximation formula $$\alpha \approx 1 - \frac{1}{2}(1 + \frac{I_1}{I_2})\frac{T_1}{\tau_s} - \frac{T_2}{\tau_s}. \tag{7}$$

is valid for $T_1$, $T_2$, $T_3 \ll \tau_s$.

In order to achieve a charge amplification as close as possible to the value 1, the intervals $T_1$ and $T_2$ should be small in relation to $\tau_s$ and further $I_2$ should not be small in relation to $I_1$. The last requirement is synonymous with $T_3 \ll \tau_s$.

FIG. 4 shows a measuring circuit indicating the amplifying circuit according to FIG. 1. The amplifier unit consisting of three diodes and three resistors was manufactured in thin film technology on alumina substrate.

$D_2$ is an AEG-Telefunken step recovery diode BXY 49, $D_1$ and $D_3$ are Schottky diodes 5082-2837 by Hewlett Packard. The 250 megabits per second word generator 40 supplies RZ words of negative polarity with a length of 32 bits and a pulse height of 0.75 volts. The 250 MHz clock frequency of the word generator is amplified in an amplifier 41 and is supplied to a pulse former 42, in which a step recovery diode is controlled by means of an inductance and in this way needle pulses of negative polarity are produced. With a variable delay line 43, the pump voltage may be displaced towards the input voltage, so that the input pulses come to lie between the pump pulses.

Figure 5B:
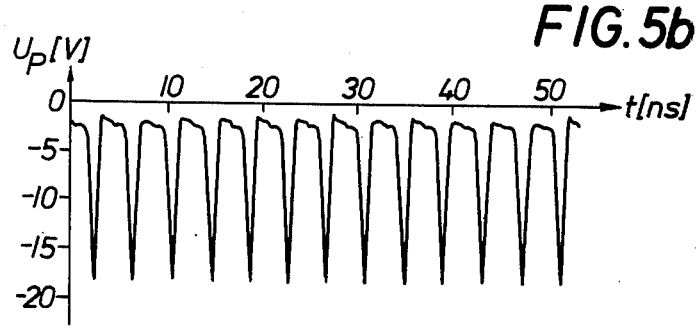
Figure 5C:
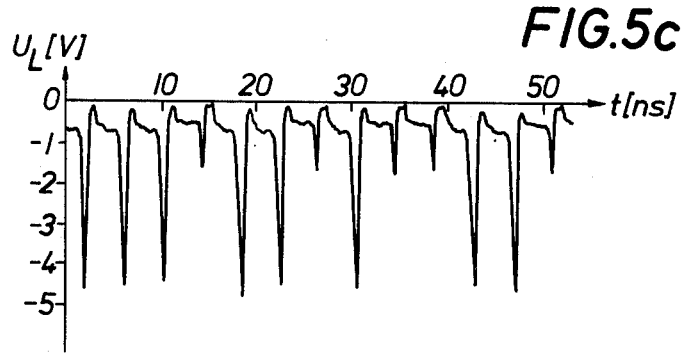

The load resistor comprises a series connection of the 68 Ohm resistor, still housed on the amplifier substrate, and of the input impedance of 50 Ohms of the attenuator in front of the sampling oscilloscope 44. A variable DC voltage is added to the input signal as well as to the pump voltage so that $D_1$ and $D_2$ are biased in the forward direction and $D_2$ may already be charged by small input signals. FIG. 5a shows the output voltage of the word generator, FIG. 5b shows the pump voltage $U_p$ at the output P of the amplifier circuit. The pump pulses have a half-width value of 700 picoseconds. They reach the step recovery diode $D_2$ by means of the voltage divider, 33 Ohms and 10 Ohms. The output voltage was measured at the connection A at 50 Ohms. FIG. 5c shows the output pulses of the amplifier, wherein the voltage scale was converted to the total load resistance of 118 Ohms.

If at the input of the amplifier there is a logical 1, then at the output there will be a pulse with an amplitude of 3.9 volts and a half width value of 500 picoseconds if at the input there is a logical 0, then at the next pump pulse there will be a small pulse at the output with a half width value of 200 picoseconds. The difference in amplitude at the output between both states is 3 volts, the amplifier therefore, has a voltage amplification of approximately four. With missing input voltage, the small output pulses are a result of the slight biasing of $D_1$ and $D_2$ in the flow direction.

The amplifier is suitable in the first instance for voltage amplification of synchronous clock pulses. With available construction elements, clock frequencies above 1 GHz may probably be achieved. Besides the amplification of the pulses, at the same time, a regeneration of the pulse form and the edge timing occurs. Its use in regeneration amplifiers for digital information transmission in wide band optical information transmission systems is, therefore, very advantageous.

The output pulses of the amplifier circuit shown in FIG. 5c have a half width value of only about 500 picoseconds. An advantageous refinement of the invention (FIG. 6) therefore, offers the possibility of adding together the output signals of several amplifier stages, according to FIG. 1, to provide a signal with a still higher bit rate. This is particularly advantageous with respect to a better use of the transmission capacity of optical waveguides.

Figure 7:
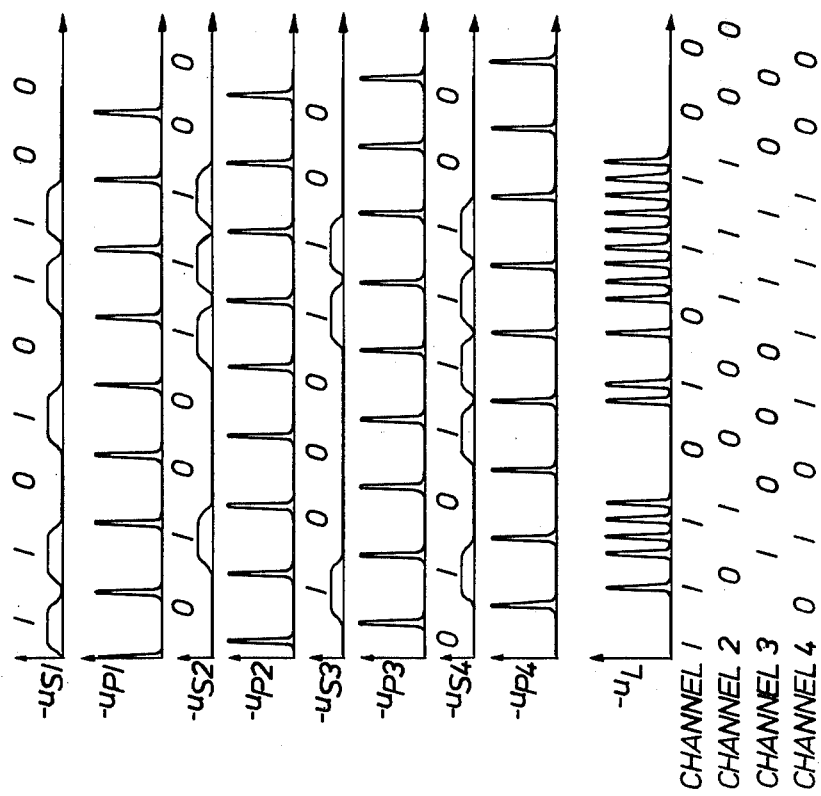
FIG. 7 shows a signal plan of the path of the signal largely to be expected in the circuit arrangement according to FIG. 6.
Figure 6:
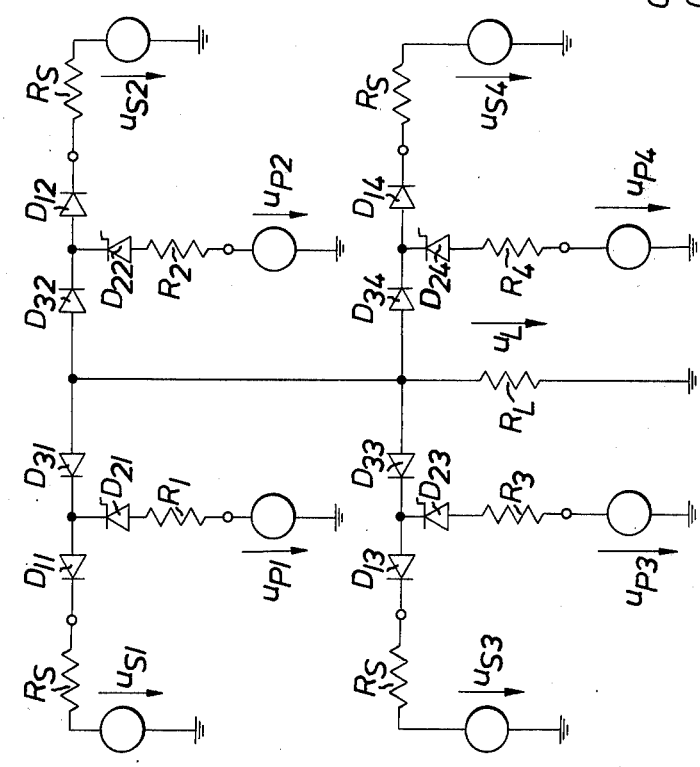
FIG. 6 shows a circuit arrangement with four amplifier stages according to FIG. 1.

The circuit arrangement shown in FIG. 6, with step recovery diodes, comprises substantially four identical amplifier stages according to FIG. 1, the outputs of which are connected in parallel and which are loaded with a common load resistor $R_L$. In FIG. 7 the signal path largely to be expected in this circuit arrangement is also shown. The circuit arrangement according to FIG. 6 may be inserted as a fourfold multiplexer. The multiplexer brings together the signals coming from four digital signal sources $u_{s1...s4}$. The four signal voltages are staggered in relation to one another in a time raster respectively by a quarter clock interval as are the four pump voltages $u_{P1...P4}$. The switching diodes $D_{31...34}$ which are on the output side, act together as OR-gates, so that the output signals of the four amplifiers for the step recovery diodes are added at the load resistor $R_L$. The same types of diodes as in the amplifier according to FIG. 1 were used as step recovery diodes and Schottky diodes. The circuit was designed for low load resistance and pulses of negative polarity, since it is provided in the first instance for controlling injection lasers. The inputs of the amplifier circuit may be controlled with ECL level; the current amplitude of the output signals is up to 100 milliamperes, so that the circuit arrangement may be used directly as a final stage for direct modulation of injection lasers in the gigabit per second region. Injection lasers may only be directly modulated in the Gbit per second region if they are biased above their threshold. Thus their differential internal resistance - load resistor $R_L$ of the circuit arrangement - is then below 1 Ohm. The resistors $R_{1...4}$ are about 50 Ohms and act as a coarse characteristic impedance matching of the pump voltage inputs to the pump supply lines. By means of the individual choice of resistance $R_{1...4}$ any dispersion of the diode parameters present was equalized.

An example of an embodiment of the multiplexer circuit was fabricated on a 1 × 1 inch alumina substrate in thin film technology. A recess was provided directly in the circuit substrate for arranging a mounting for an injection laser, located therein, and a plug connection for a monomode waveguide. The direct assembly of the injection laser with the final stage is definitely required due to the relatively low electrical impedance of the laser.

FIG. 8 shows a measuring circuit for testing the circuit arrangement according to FIG. 6. At the signal inputs there is, in the logical state 0, a voltage of $U_o =$ 0.3 volts and, in the logical state 1, the voltage $u_1 =$ −0.9 volts. While the signal word of the 250 megabit per second word generator 80, amplified to a pulse amplitude of 1.4 volts, arrives at the input S1, the voltage $U_o$ or $U_1$ is constantly applied to the signal input S2, S3 and S4 of the multiplexer. From the amplified word generator clock pulse pump, pulses with an amplitude of 15 volts and a half width value of 500 picoseconds are produced using a pulse former 81. With a wide band power divider 82 the pump signal is divided up into four delay lines 83 with a 50 Ohm characteristic impedance, the length of which is distinguished respectively by 20 centimeters from one another. The pump voltages at the four inputs P1 . . . P4 are staggered in relation to one another respectively by 1 nanosecond. FIG. 9a shows a section of the signal word set at the word generator. In the FIGS. 9b – 9e the measured output signal of the multiplexer is shown. In all cases, the signal word delivered by the word generator lies at the input S1. The voltage $U_o$ is applied respectively to the inputs S1 . . . S4 with the curve of FIG. 9b.

If the voltage $U_1$ is applied gradually to the inputs S2 . . . S4 then the load current trace shown in FIGS. 9c, 9d, 9e is obtained. There is no mutual influencing of the pulses. The amplitude of about 100mA is sufficient for the direct modulation of a biased semiconductor laser. In a position $U_1$, a current with a medium value of 16 mA was measured at the inputs S2 . . . S4. By means of the accumulation of the charge flowing into the step recovery diode, a current which is substantially lower in comparison to the output current is required for controlling the multiplexer.

Figure 15:
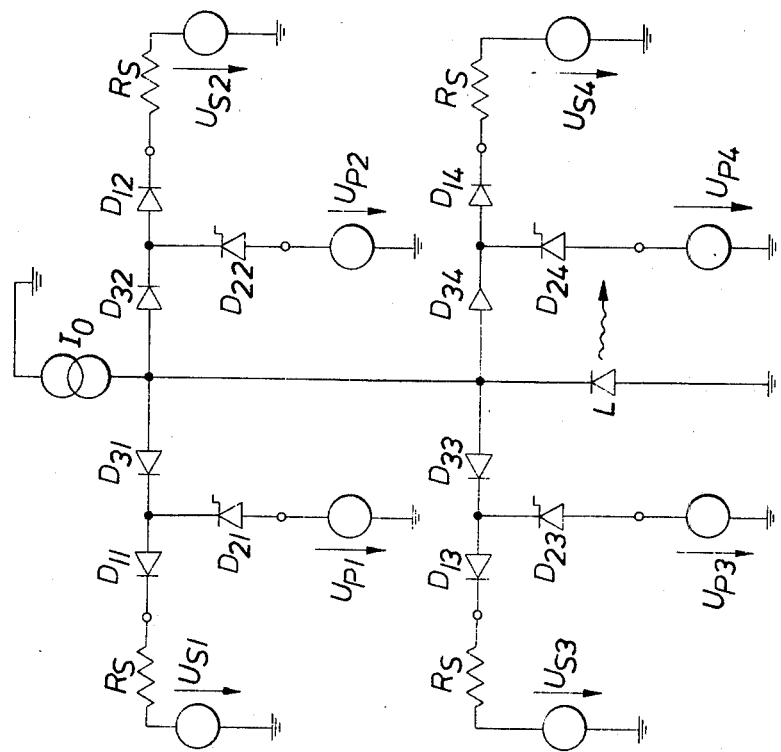
FIG. 15 shows a circuit arrangement corresponding substantially to FIG. 6 with an injection laser L as a load resistor.

FIG. 15 shows once again the circuit arrangement, which is already described by way of FIG. 6, with four identical amplifier stages, which is suitable for use as a multiplexer, wherein the load resistance $R_L$ of FIG. 6 is replaced by a semiconductor injection laser. A DC current source Io acts to bias the injection laser above its threshold.

Figure 10:
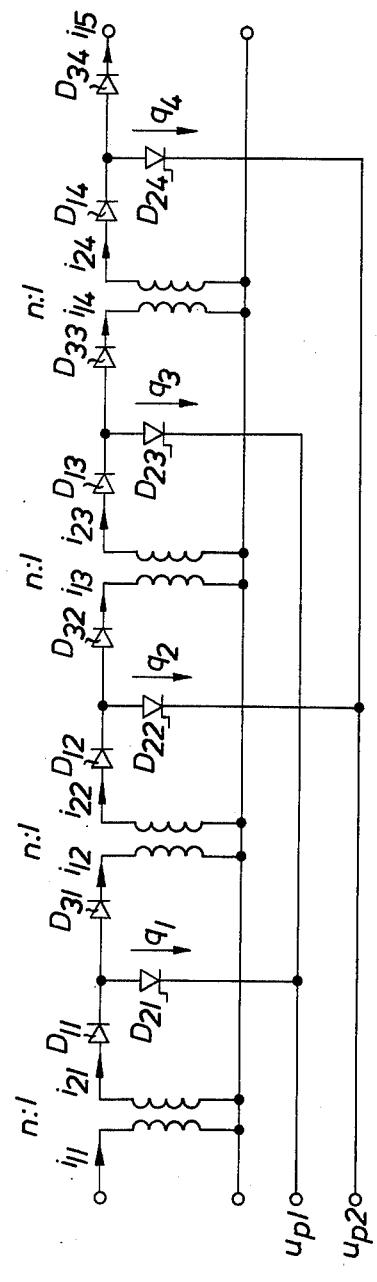
FIG. 10 shows a circuit diagram of a multistage amplifier with transformer coupling.

In an advantageous embodiment of the invention, several amplifier stages are cascaded the (FIG. 10). The amplifier stages are coupled by means of n:1 transformers so that the voltage amplification is transformed into a current amplification. The two pump voltages $u_{p1}$ and $u_{p2}$ are shifted in relation to one another by half a clock pulse interval.

Figure 12:
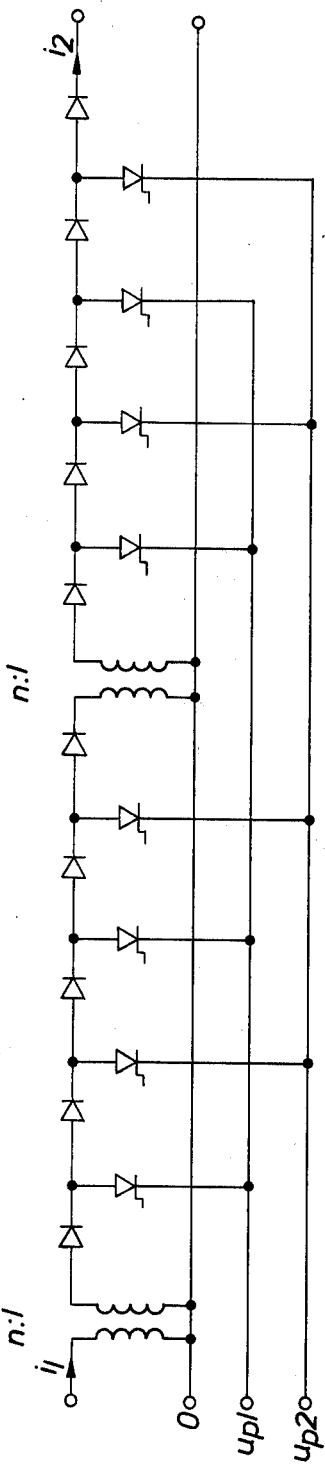
FIG. 12 shows a circuit diagram of a shift register using the circuit arrangement of FIG. 1.

In FIG. 11 is shown the time behavior of currents, voltages and charges in FIG. 10. The current amplitude of the input impulse is increased by the input transformer. The limit for the step down ratio of the input transformer is given by the voltage required to charge the step recovery diode. The forward voltage drop of $D_{11}$ and $D_{21}$ may be compensated by the negative biassing of $u_{p1}$ during the clock pulse pauses. Since, with increasing charge $q_1$ the voltage increases at $D_{21}$, $i_{21}$ decreases and the charging process is slowed down. With too strong a step down, ratio the voltage of the input pulses finally is not sufficient for charging $D_{21}$ at all, since the current flow stops if the voltage rises to $D_{21}$ by the downwardly transformed no-load voltage amplitude of the input signal. By means of the pump pulse $u_{p1}$ the charge of $D_{21}$ is removed. Thus the discharge current $i_{12}$ is transformed up to $i_{22}$ by the coupling transformer and $D_{22}$ is charged with the charge $q_{22}$ which is n-fold in comparison to $q_1$. The discharge of $D_{22}$ takes place during the pump pulse $u_{p2}$. In this way a n-fold amplification of the pulse energy or n-fold power amplification is achieved in each step. The signal is shifted by half a clock pulse interval from step to step. This facilitates, moreover, use as a shift register. In the first instance, with interest in its use as a shift register, and not in the amplification, so it is not necessary, to couple all stages by means of transformers. After a few stages which are not coupled by transformer, which stages have a charging amplification smaller than 1, the fall in current amplitude is made up by a transformer. FIG. 12 shows a circuit of one such shift register.

Figure 13:
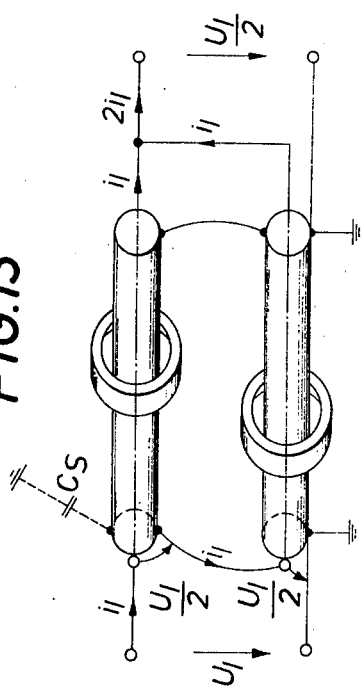
FIG. 13 shows the construction of a transformer suitable for the amplifier circuit with transformer couplings according to FIG. 10.
Figure 14:
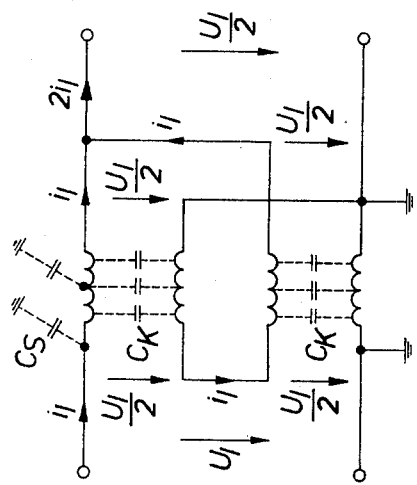
FIG. 14 shows an equivalent circuit diagram of the transformer according to FIG. 13.

With clock pulse frequencies of a few hundred MHz or even in the GHz region, the required transformers may be realized as line-transformers. Stronger step down ratios than 2:1 are not possible generally, since otherwise, with such transformers the stray capacitances have too large an effect. The transformers may be constructed with coaxial lines or in strip line technology. FIG. 13 shows a 2:1 line transformer constructed of coaxial lines and FIG. 14 shows its equivalent circuit diagram. The line transformer consists of two coaxial lines which are connected in series at the input side and in parallel at the output side.

A low lower cutoff frequency requires a large main inductance. In order to obtain a high upper cutoff frequency stray inductances and stray capacitances should be small. A large main inductance is achieved by means of long lines with a small outer diameter and by means of ferrite rings on the lines, a low leakage inductance is achieved by short lines with a small characteristic impedance. The $C_k$ are distributed stray capacitances between inner and outer conductor of the coaxial lines and $C_s$ are the distributed stray capacitances of the outer casing of the coaxial line which is not earthed on the input side. A small $C_k$ is achieved by short lines with small outer diameters. From this, for the construction of the transformer, the lines should be short and should have a small outer diameter. $C_s$ is made small by means of the small outer diameter and the main inductance is large, despite the small length of the line, while the short length ensures a small $C_k$ and a small stray inductance or small signal propagation time.

A power amplification below 2, which may be achieved with such transformers, is sufficient in power amplifiers where it is less a question of the stage amplification than a question of the output power which may be achieved.

It will be understood that the above description of the present invention is susceptible to various modification changes and adaptations.

What is claimed is:

1. A circuit arrangement for amplifying and multiplexing a plurality of electrical pulsed signals comprising: a plurality of step recovery diodes; a plurality of signal sources, one for each said diode, each providing a respective sequence of pulsed signals; a plurality of first switching diodes each connected between a respective step recovery diode and a respective signal source and poled to conduct current in the forward direction of its respective step recovery diode for conducting pulsed signals from its respective signal source to its respective step recovery diode in a manner to cause each such pulsed signal to charge said respective step recovery diode; a plurality of pump sources each producing a train of clock pulses and each connected to a respective one of said step recovery diodes for biasing its respective step recovery diode and said first switching diode connected thereto in the forward direction during the intervals between clock pulses and for causing each such clock pulse to produce a current flow in the reverse direction of its respective step recovery diode whenever said step recovery diode is in a charged state, each current flow produced by a clock pulse acting to discharge said respective step recovery diode; a plurality of second switching diodes each having one terminal connected to the point of connection between a respective step recovery diode and first switching diode, with the other terminal of all of said second switching diodes being connected to a common output point, and a common load resistor connected between said common output point and ground, each said second switching diode being poled to be biased in its reverse direction during the intervals between clock pulses and in its forward direction during a clock pulse whenever its respective step recovery diode is in a charged state, to cause each reverse current flow occurring in each said step recovery diode to flow through, and act upon, said common load resistor, wherein each said signal source is arranged to supply pulsed signals and each said pump source is arranged to supply clock pulses at a predetermined repetition rate which has the same value for all of said sources, the pulsed signals from different ones of said signal sources are offset in time from one another by an amount equal to the repetition rate period divided by the total number of said step recovery diodes, and the signal pulses produced by each said signal source occur in the intervals between the clock pulses produced by that pump source connected to the same step recovery diode, whereby said load resistor provides an output signal constituting an amplified and time multiplexed representation of all of said pulsed signals.

2. A circuit arrangement as defined in claim 1, wherein said arrangement is manufactured using thin film technology.

3. A circuit arrangement as defined in claim 1, and comprising a biased injection laser acting as said load resistor until raised above the laser threshold by a direct current source.

4. A circuit arrangement as defined in claim 3, wherein said injection laser is connected to the circuit arrangement by using supply lines which are as short as possible.

* * * * *